United States Patent
Takagi

(10) Patent No.: US 7,157,209 B2
(45) Date of Patent: Jan. 2, 2007

(54) MANUFACTURING PROCESS OF ALUMINUM SUPPORT FOR PLANOGRAPHIC PRINTING PLATE, ALUMINUM SUPPORT FOR PLANOGRAPHIC PRINTING PLATE, PLANOGRAPHIC PRINTING PLATE MATERIAL AND IMAGE FORMATION PROCESS

(75) Inventor: Hiroshi Takagi, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/055,138

(22) Filed: Feb. 9, 2005

(65) Prior Publication Data
US 2005/0199505 A1 Sep. 15, 2005

(30) Foreign Application Priority Data
Feb. 17, 2004 (JP) .............................. 2004-039564

(51) Int. Cl.
*G03F 7/09* (2006.01)
(52) U.S. Cl. ............... 430/281.1; 430/278.1; 430/286.1; 430/302; 430/309; 430/494; 430/944; 430/945

(58) Field of Classification Search ............ 430/270.1, 430/278.1, 281.1, 286.1, 302, 309, 494, 944, 430/945
See application file for complete search history.

(56) References Cited

U.S. PATENT DOCUMENTS

| 4,294,672 A * | 10/1981 | Ohba et al. ................ 205/646 |
| 6,103,087 A * | 8/2000 | Mori ......................... 205/214 |
| 2003/0031860 A1* | 2/2003 | Hotta et al. ............... 428/336 |
| 2004/0055490 A1* | 3/2004 | Sampei ..................... 101/458 |
| 2005/0153242 A1* | 7/2005 | Takagi ....................... 430/300 |

* cited by examiner

Primary Examiner—Barbara L. Gilliam
(74) Attorney, Agent, or Firm—Frishauf, Holtz, Goodman & Chick, P.C.

(57) ABSTRACT

A process for manufacturing an aluminum support for a planographic printing plate material, the process containing the steps of: (a) electrolytically surface-roughening an aluminum plate in an electrolyte solution containing hydrochloric acid as a main component; and (b) anodizing the surface-roughened aluminum plate, wherein the step (a) contains: (i) a first stage which surface-roughens the aluminum plate employing a sine-wave alternating current; and (ii) a second stage which surface-roughens the aluminum plate employing a controlled sine-wave alternating current using a thyristor so that a current flow starts at a phase angle of 60 to 120 degree of an alternating current cycle.

10 Claims, 1 Drawing Sheet

US 7,157,209 B2

MANUFACTURING PROCESS OF ALUMINUM SUPPORT FOR PLANOGRAPHIC PRINTING PLATE, ALUMINUM SUPPORT FOR PLANOGRAPHIC PRINTING PLATE, PLANOGRAPHIC PRINTING PLATE MATERIAL AND IMAGE FORMATION PROCESS

FIELD OF THE INVENTION

The present invention relates to a manufacturing process of an aluminum support for a planographic printing plate, a planographic printing plate aluminum support, a planographic printing plate material and an image formation process, and particularly, to a manufacturing process of an aluminum support for a so-called digital printing plate obtained by writing an image on a planographic printing plate material through a laser based on data in a computer, an aluminum support prepared according to the manufacturing process, and a planographic printing plate material comprising the aluminum support, and provided thereon, an image formation layer as well as an image formation process using the same.

BACKGROUND OF THE INVENTION

Planographic printing is a printing process employing property that oil and water repel each other. There are non-image portions receiving water but repelling oily ink and image portions receiving oily ink but repelling water on the surface of the planographic printing plate.

An aluminum support used in the planographic printing plate material is required to have conflicting properties of high hydrophilicity and high water retention on one hand and high adhesion to an image formation layer provided thereon on the other hand. A support with poor hydrophilicity attracts ink at non-image portions, resulting in so-called background contamination. A support with poor water retention, when the supply amount of a dampening solution to a printing plate is small, produces background contamination, resulting in lowering of water tolerance.

Recently, CTP, in which a digital image data is directly written in a planographic printing plate material through a laser has been developed and put into practical use. As a laser light source is used a visible light source having a longer wavelength such as an Ar laser (488 nm), an FD-YAG laser (532 nm) or a high power semiconductor laser having an emission wavelength not less than 750 nm. Further, a semiconductor laser (hereinafter also referred to as a violet laser) employing, for example, InGaN or ZnSe type material, which can continuously emit light with a wavelength of from 380 to 430 nm, is about to be put into practical use.

A planographic printing plate material with an image formation layer meeting the respective laser has been also developed.

An aluminum support for a planographic printing plate is generally manufactured by surface-roughening an aluminum plate surface according to a process comprising an appropriate combination of steps selected from mechanical surface-roughening, chemical etching in an acidic or basic solution, desmutting in an acidic solution, electrolytical surface-roughening, anodizing in an acidic solution, hydrophilizing treatment, and sealing treatment.

Particularly, the electrolytical surface-roughening has been generally used as a surface roughening method of an aluminum support for a planographic printing plate, since a uniformly roughened surface is easily obtained. The electrolytical surface-roughening is ordinarily carried out in an aqueous hydrochloric acid solution or in an aqueous nitric acid solution.

Various manufacturing processes of the aluminum support for a planographic printing plate have been proposed (see, for example, Patent Documents 1–7).

However, a planographic printing plate material, comprising an aluminum support manufactured according to these processes, and an image formation layer provided thereon, is insufficient in adhesion of the image formation layer to the support, and a planographic printing plate, which is prepared from such a planographic printing plate material according to a plate making process comprising imagewise exposure by laser, has problems in that small dot reproduction or printing durability is poor. Particularly when printing is carried out employing ink containing no VOC (volatile organic compound), the planographic printing plate provides poor printing durability or poor water tolerance.

(Patent Document 1) Japanese Patent Publication Open to Public Inspection (hereafter, is called as JP-A) No. 2003-039846

(Patent Document 2) JP-A No. 2003-019878
(Patent Document 3) JP-A No. 2003-019877,
(Patent Document 4) JP-A No. 2002-363799,
(Patent Document 5) JP-A No. 2002-362046,
(Patent Document 6) U.S. Pat. No. 5,122,243
(Patent Document 7) U.S. Pat. No. 5,186,795

SUMMARY OF THE INVENTION

An object of the invention is to provide a manufacturing process of an aluminum support for a planographic printing plate material, which is suitable for laser exposure and provides excellent small dot reproduction, high printing durability and wide water tolerance, an aluminum support manufactured by the process, and a planographic printing plate material comprising the aluminum support. Further object is an image formation process using the planographic printing plate using the same printing plate.

In accordance with the object, there is provided a process for manufacturing an aluminum support for a planographic printing plate, the process comprising the steps of electrolytically surface-roughening an aluminum plate in an electrolyte solution containing hydrochloric acid as a main component, employing a sine-wave alternating current and a controlled sine-wave alternating current, and then anodizing the surface-roughened aluminum plate.

DETAILED DESCRIPTION OF THE INVENTION

Figure 1:
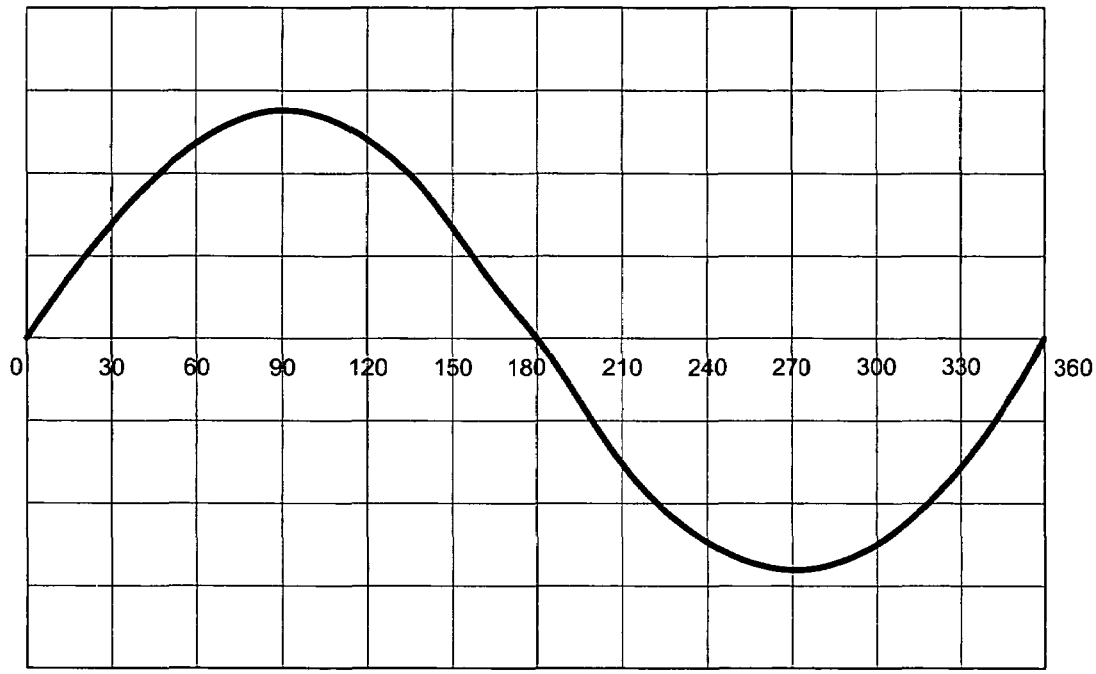
FIG. 1 is a schematic drawing of a regular sine-wave alternating current.

The above object of the invention can be attained by the followings:

(1) A process for manufacturing an aluminum support for a planographic printing plate material, the process comprising the steps of:

(a) electrolytically surface-roughening an aluminum plate in an electrolyte solution containing hydrochloric acid as a main component; and (b) anodizing the surface-roughened aluminum plate, wherein the step (a) contains:

(i) a first stage which surface-roughens the aluminum plate employing a sine-wave alternating current; and (ii) a second stage which surface-roughens the aluminum plate employing a controlled sine-wave alternating current using a thyristor so that a current flow starts at a phase angle of 60 to 120 degree of an alternating current cycle.

(2) The process for manufacturing an aluminum support of the above-described item 1, wherein a ratio of an electrolysis operating time (measured in second) in the first stage ($t_1$) to an electrolysis operating time (measured in second) in the first stage ($t_2$), $t_1:t_2$ is between 1:1 and 5:1; and a total quantity of electricity Q which is obtained by adding a quantity of electricity in the first stage ($Q_1$) and a quantity of electricity in the first stage ($Q_2$) is between 600 and 1500 $C/dm^2$.

(3) The process for manufacturing an aluminum support of the above-described item 1 or item 2, wherein the electrolyte solution has a hydrochloric acid concentration of 5 to 20 g/liter and an aluminum ion concentration of 0.5 to 15 g/liter, and a temperature of the electrolyte solution is from 15 to 35° C.

(4) The process for manufacturing an aluminum support of the above-described items 1 to 3, wherein the electrolyte solution further contains acetic acid in an amount of from 1 to 20 g/liter.

(5) The process for manufacturing an aluminum support of the above-described items 1 to 3, wherein the electrolyte solution further contains boric acid in an amount of from 1 to 20 g/liter.

(6) The process for manufacturing an aluminum support of the above-described items 1 to 5, wherein the first stage and the second stage in the step (a) are carried out in the same electrolyte solution.

(7) An aluminum support for a planographic printing plate prepared according to the process of the above-described items 1 to 6.

(8) A planographic printing plate material comprising the aluminum support of the above-described item 7, and provided thereon, an image formation layer selected from the group consisting of a negative working image formation layer and a positive working image formation layer.

(9) The planographic printing plate material of the above-described item 8, wherein the image formation layer is the negative working image formation layer, and the negative working image formation layer is a photopolymerizable image formation layer comprising a photopolymerizable composition.

(10) The planographic printing plate material of the above-described item 8, wherein the image formation layer is capable of being developed on a printing press.

(11) An image formation process comprising the steps of:

imagewise exposing the planographic printing plate material of the above-described items 8–10 to a laser.

The present invention will be explained in detail below.

(Aluminum Support)

As a substrate for the aluminum support of the planographic printing plate of the invention, an aluminum plate is used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. Further, an aluminum plate manufactured by rolling can be used. A regenerated aluminum plate obtained by rolling aluminum regenerated from scrapped or recycled materials, which has recently spread, can be also used.

It is preferable that the aluminum plate for the support used in the planographic printing plate of the invention is subjected to degreasing treatment for removing rolling oil prior to surface-roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting plate is preferably subjected to desmut treatment in an aqueous solution of an acid such as phosphoric acid, nitric acid, sulfuric acid, chromic acid, or a mixture thereof, since smut is produced on the surface of the support.

Subsequently, surface-roughening treatment is carried out. In the invention, an electrolytic surface-roughening treatment (or called as an electrochemical surface-roughening treatment) is carried out in an electrolyte solution containing hydrochloric acid as a main component, employing an alternating current. However, prior to the electrolytic surface-roughening treatment in the electrolyte solution containing hydrochloric acid, electrolytic surface-roughening treatment may be carried out in an electrolyte solution containing nitric acid as a main component, employing an alternating current, or mechanical surface-roughening treatment may be carried out.

Though there is no restriction for the mechanical surface-roughening method, a brushing roughening method and a honing roughening method are preferable. The brushing roughening method is carried out by rubbing the surface of the plate with a rotating brush with a brush hair with a diameter of 0.2 to 0.8 mm, while supplying slurry in which volcanic ash particles with a particle size of 10 to 100 µm are dispersed in water to the surface of the plate. The honing roughening method is carried out by ejecting obliquely slurry with pressure applied from nozzles to the surface of the plate, the slurry containing volcanic ash particles with a particle size of 10 to 100 µm dispersed in water. Surface-roughening can be also carried out by laminating the plate surface with a sheet on the surface of which abrading particles with a particle size of from 10 to 100 µm has been coated at intervals of 100 to 200 µm and at a density of $2.5×10^3$ to $10×10^3/cm^2$, and then applying pressure to the laminated sheet to transfer the roughened pattern of the sheet, whereby the plate surface is roughened.

After the plate has been roughened mechanically, it is preferably dipped in an acid or an aqueous alkali solution in order to remove abrasives and aluminum dust, etc. which have been embedded in the surface of the support. Examples of the acid-include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous solution of alkali chemicals such as sodium hydroxide is preferably used. The dissolution amount of aluminum in the plate surface is preferably 0.5 to 5 g/m$^2$. After the plate has been dipped in the aqueous alkali solution, it is preferable for the plate to be dipped in an acid such as phosphoric acid, nitric acid, sulfuric acid and chromic acid, or in a mixed acid thereof, for neutralization.

In the electrolytic surface-roughening treatment carried out in the electrolyte solution containing nitric acid, voltage applied is generally from 1 to 50 V, and preferably from 10 to 30 V. The current density used can be selected from the range from 10 to 200 A/dm$^2$, and is preferably from 20 to 100 A/dm$^2$. The quantity of electricity can be selected from the range of from 100 to 5000 C/dm$^2$, and is preferably 100 to 2000 C/dm$^2$. The temperature during the electrolytic surface-roughening treatment may be in the range of from 10 to 50° C., and is preferably from 15 to 45° C. The nitric acid concentration in the electrolyte solution is preferably from 1 to 20 g/liter. It is possible to optionally add, to the electrolyte solution, nitrates, chlorides, amines, aldehydes, phosphoric acid, chromic acid, boric acid, acetic acid, oxalic acid or aluminum salts.

After the plate has been subjected to electrolytic surface-roughening treatment in the electrolyte solution containing nitric acid, it is preferably dipped in an acid or an aqueous alkali solution in order to remove abrasives and aluminum dust, etc. which have been embedded in the plate surface. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the plate surface is preferably 0.5 to 5 g/m$^2$. After the plate has been dipped in the aqueous alkali solution, it is preferable for the plate to be dipped in an acid such as phosphoric acid, nitric acid, sulfuric acid and chromic acid, or in a mixed acid thereof, for neutralization.

In the present invention, two electrolysis stages are involved to surface-roughen the aluminum support in an electrolyte solution containing hydrochloric acid as a main component. The two stages, a first and a second electrolytic surface-roughening stages, each employs a different alternating-current wave from each other. In the first stage a regular sine-wave alternating current is applied; and in the second stage a controlled sine-wave alternating current is applied. In the second stage, a thyristor is used to control a current flow which starts at a phase angle selected from 60 to 120 degree of an alternating current cycle.

The hydrochloric acid concentration of the electrolyte solution of the present invention is from 5 to 20 g/liter, and preferably from 6.5 to 16 g/liter. The temperature of the electrolyte solution is from 15 to 35° C., and preferably from 18 to 32° C. The aluminum ion concentration of the electrolyte solution is from 0.5 to 15 g/liter, and preferably from 0.7 to 10 g/liter. In the invention, the aluminum ion concentration is represented in terms of amount (g/liter) of aluminum dissolved in 1 liter of the electrolyte solution. The electrolyte solution preferably contains acetic acid or boric acid, whose concentration is from 1 to 20 g/liter, and preferably from 3 to 15 g/liter. The concentration ratio of acetic acid or boric acid to hydrochloric acid is preferably between 0.5:1 and 1.5:1. The frequency of the sinewave alternating current is from 40 to 150 Hz, and preferably from 45 to 100 Hz.

The ratio of an electrolytic time (second) $t_1$ at the first electrolytic surface-roughening stage to an electrolytic time $t_2$ (second) at the second electrolytic surface-roughening stage, $t_1$:$t_2$ is between 1:1 and 5:1. The total quantity of electricity Q (quantity of electricity $Q_1$ at the first electrolytic surface-roughening stage+quantity of electricity $Q_2$ at the second electrolytic surface-roughening stage) is from 600 to 1500 C/dm$^2$. The electrolyte solutions used in the first and second electrolytic surface-roughening stages may be the same or different, however, the electrolyte solutions are preferably the same from economical point of view. An interval time between the first and second electrolytic surface-roughening stages is not limited, but it is preferred that the first and second electrolytic surface-roughening stages are continuously carried out. In each of the first and second electrolytic surface-roughening stages, the electrolytic surface-roughening may be carried out intermittently.

A thyristor control is one of the controlling methods for current output. It enables to start a current flow at a required phase of an AC cycle having a half cycle of 180 degree. The alternating-wave shape after controlled by a thyristor exhibits a period in which no current flow is observed from a phase angle of 0 degree to the predetermined starting phase angle of an alternating current cycle.

Figure 2:
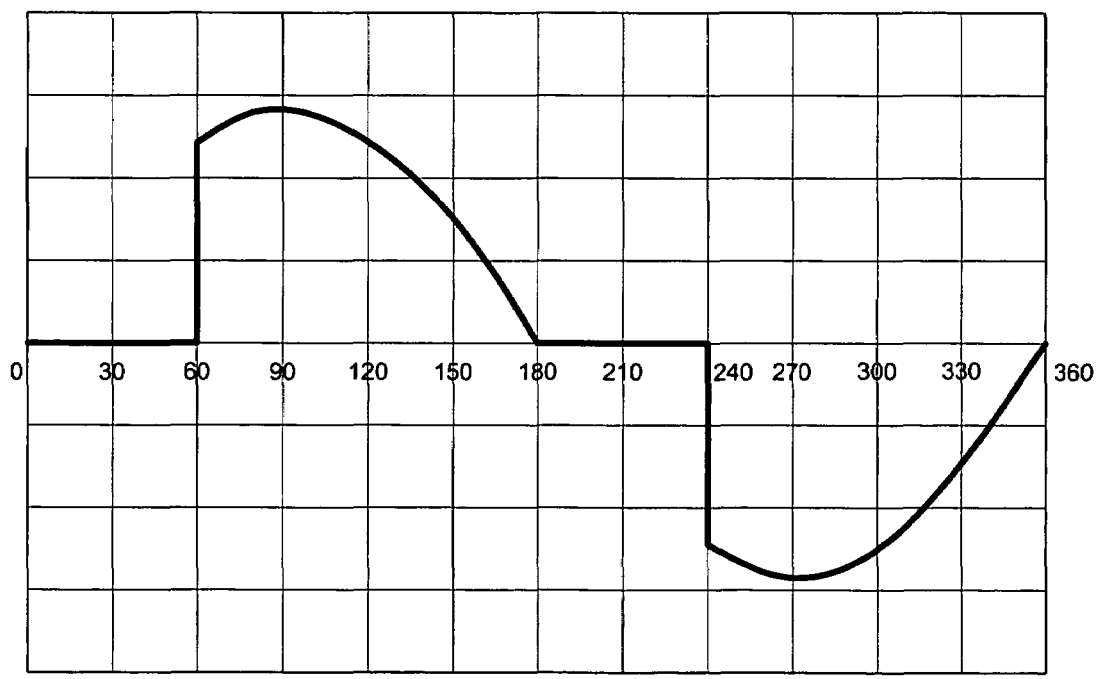
FIG. 2 is a schematic drawing of an example of a controlled sine-wave alternating current which starts current flow at a phase angle of 60 degree of an AC cycle.

FIG. 1 shows a regular sine-wave alternating current. FIG. 2 shows an example of a controlled sine-wave alternating current which starts current flow at a phase angle of 60 degree of an AC cycle. In FIG. 1 and FIG. 2, the abscissa axis indicates a phase angle; and the axis of ordinate indicates a current voltage in an arbitrary scale.

After the plate has been subjected to electrolytic surface roughening treatment in the electrolyte solution containing hydrochloric acid, it is preferably dipped in an acid or an aqueous alkali solution in order to remove abrasives and aluminum dust, which have been embedded in the plate surface. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium phosphate or sodium hydroxide is preferably used. The dissolution amount of aluminum in the plate surface is preferably 0.1 to 2 g/m$^2$. After the plate has been dipped in the aqueous alkali solution, it is preferable for the plate to be dipped in an acid such as phosphoric acid, nitric acid, sulfuric acid and chromic acid, or in a mixed acid thereof, for neutralization.

After the surface-roughening treatment, anodizing treatment is carried out. There is no restriction in particular for the method of anodizing treatment used in the invention, and known methods can be used. The anodizing treatment forms an oxidized aluminum film on the plate surface. Generally, the anodizing treatment is carried out in an aqueous electrolyte solution containing sulfuric acid, phosphoric acid or their mixture by applying a direct current.

In the invention, the anodizing treatment is carried out preferably in a sulfuric acid solution. The sulfuric acid concentration of the sulfuric acid solution is preferably from 5 to 50% by weight, and more preferably from 10 to 35% by weight. The temperature of the sulfuric acid solution is preferably from 10 to 50° C. Voltage applied is preferably not less than 18 V, and more preferably not less than 20 V. Current density applied is preferably from 1 to 30 A/dm$^2$. Quantity of electricity is preferably from 100 to 500 C/dm$^2$.

The coated amount of the formed anodization film is suitably 1 to 50 mg/dm$^2$, and preferably 10 to 40 mg/dm$^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water. Micro pores are formed in the anodization film. The micro pore density in the anodization film is preferably from 400 to 700/µm$^2$, and more preferably from 400 to 600/µm$^2$.

The aluminum plate, which has been subjected to anodizing treatment, is optionally subjected to sealing treatment. For the sealing treatment, it is possible to use known methods using hot water, boiling water, steam, a sodium silicate solution, an aqueous dichromate solution, a nitrite solution and an ammonium acetate solution.

After the above treatments, the resulting aluminum plate is optionally subjected to hydrophilic treatment. The hydrophilic treatment method is not specifically limited. The support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye, an amine salt. The sol-gel treatment support which is disclosed in JP-A No.5-304358 is suitably used. That support has a functional group as a covalent bond capable of causing addition reaction by radicals. It is preferred that the plate surface is subjected to hydrophilic treatment employing polyvinyl phosphoric acid. The hydrophilic treatment method is not specifically limited. There is for example, a coating method, a spraying method, or a dipping method. The dipping method is preferred in that the facility is relatively inexpensive. The solution used in the dipping method is preferably an aqueous solution containing 0.05 to 3 wt % polyvinyl phosphonic acid. The treating temperature is preferably from 20 to 90° C., and the treating time is preferably from 10 to 180 seconds. After the hydrophilic treatment, excessive polyvinyl phosphonic acid is removed from the support surface preferably through washing or squeezing. After that, it is preferred that the support is dried at preferably from 20 to 95° C.

(Image Formation Layer)

An image formation layer, on which an image can be formed by laser light exposure, is provided on the support in the invention. The image formation layer is not specifically limited, and may be one requiring development treatment, for example, one of the thermal positive working type, the thermal negative working type, or the photopolymer type; or one capable of being developed on a printing press or so called, one of the processless type. A planographic printing plate material of the photopolymer type (a photopolymerizable light sensitive planographic printing plate material) will be explained in detail below.

(Photopolymerization Initiator)

The planographic printing plate material of the invention is preferably a photopolymerizable light sensitive planographic printing plate material. A photopolymerization initiator used in the image formation layer (hereinafter also referred to as light sensitive layer) of the photopolymerizable light sensitive planographic printing plate material is preferably a titanocene compound, a triarylmonoalkylborate ammonium salt or an iron-arene complex.

As the titanocene compounds, there are compounds disclosed in JP-A Nos. 63-41483 and 2-291. Preferred examples thereof include bis(cyclopentadienyl)-Ti-dichloride, bis(cyclopentadienyl)-Ti-bisphenyl, bis(cyclopentadienyl)-Ti-bis-2,3,4,5,6-pentafluorophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis(methylcyclopentadienyl)-Ti-bis-2,3,5,6-tetrafluorophenyl, bis(methylcyclopentadienyl)-Ti-bis-2,4-difluorophenyl (IRUGACURE 727L, produced by Ciba Specialty Co., Ltd.), bis(cyclopentadienyl)-bis(2,6-difluoro-3-(pyry-1-yl)phenyl) titanium (IRUGACURE 784, produced by Ciba Specialty Co., Ltd.), bis(cyclopentadienyl)-bis(2,4,6-trifluoro-3-(pyry-1-yl)phenyl) titanium, and bis(cyclopentadienyl)-bis(2,4,6-trifluoro-3-(2,5-dimethylpyry-1-yl)phenyl) titanium.

As the monoalkyltriaryl borate compounds, there are those described in JP-A Nos. 62-150242 and 62-143044. Preferred examples of the monoalkyl-triaryl borate compounds include tetra-n-butyl ammonium n-butyl-trinaphthalene-1-yl-borate, tetra-n-butyl ammonium n-butyl-triphenyl-borate, tetra-n-butyl ammonium n-butyl-tri-(4-tert-butylphenyl)-borate, tetra-n-butyl ammonium n-hexyl-tri-(3-chloro-4-methylphenyl)-borate, and tetra-n-butyl ammonium n-hexyl-tri-(3-fluorophenyl)-borate.

As the iron arene complexes, there are those described in JP-A No. 59-219307. Preferred examples of the iron arene complex include η-benzene-(η-cyclopentadienyl)iron.hexafluorophosphate, η-cumene)-(η-cyclopentadienyl)iron.hexafluorophosphate, η-fluorene-(η-cyclopentadienyl)iron.hexafluorophosphate, η-naphthalene-(η-cyclopentadienyl)iron.hexafluorophosphate, η-xylene-(η-cyclopentadienyl)iron.hexafluorophosphate, and η-benzene-(η-cyclopentadienyl)iron.hexafluoroborate.

Another photopolymerization initiator can be used in combination. Examples thereof include carbonyl compounds, organic sulfur compounds, peroxides, redox compounds, azo or diazo compounds, halides and photo-reducing dyes disclosed in J. Kosar, "Light Sensitive Systems", Paragraph 5, and those disclosed in British Patent No. 1,459,563.

Typical examples of the photopolymerization initiator used in combination include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis(dimethylamino)benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and JP-A No. 60-60104; an organic peroxide compound disclosed in JP-A Nos. 59-1504 and 61-243807; a diazonium compound in Japanese Patent Publication Nos. 0.43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36 22062b, 37-13109, 38-18015 and 45-9610; various onium compounds disclosed in Japanese Patent Publication No. 55-39162; JP-A No.

59-14023 and "Macromolecules", Volume 10, p. 1307 (1977); azo compounds disclosed in Japanese Patent Publication No. 59-142205; metal arene complexes disclosed in JP-A No. 1-54440, European Patent Nos. 109,851 and 126,712, and "Journal of Imaging Science", Volume 30, p. 174-(1986); (oxo) sulfonium organoboron complexes disclosed in JP-A Nos. 5-213861 and 5-255347; titanocenes disclosed in JP-A Nos. 59-152396 and 61-151197; transition metal complexes containing a transition metal such as ruthenium disclosed in "Coordination Chemistry Review", Volume 84, p. 85–277 (1988) and JP-A No. 2-182701; 2,4,5-triarylimidazol dimmer disclosed in JP-A No. 3-209477; carbon tetrabromide; organic halide compounds disclosed in JP-A No. 59-107344.

(Trihaloalkyl Compound)

When an addition polymerizable ethylenically unsaturated monomer containing a light oxidizable group is used in the light sensitive layer of the planographic printing plate material, a known compound with a photolytic trihaloalkyl group is preferably used in combination for a free-radical generating photoinitiator. This type of the photoinitiator is preferably a compound containing chlorine or bromine as a halogen. The trihaloalkyl group is preferably a trihalomethyl group, and is bonded directly or through a conjugated chain to an aromatic hydrocarbon or heterocyclic ring. A compound having a triazine ring with two trihalomethyl groups is preferred, and compounds disclosed in EP-A-137,452, and DE-A-2,118,259 and DE-A-2,243,621 is especially preferred. These compounds have an absorption at near ultraviolet regions, for example, at wavelength regions from 350 to 400 nm. An initiator having little or no absorption at the spectral regions of the emitted light, for example, trihalomethyltriazine of mesomerism structure having a substituent or aliphatic group with a short conjugated system is suitably used. A compound having an absorption at far ultraviolet regions, for example, phenyl trihalomethyl sulfone (typically, phenyl tribromomethyl sulfone) or phenyl trihalomethyl ketone, is also suitably used.

(Sensitizing Dye)

The light sensitive layer of the planographic printing plate material of the invention preferably contains a sensitizing dye having an absorption maximum in the wavelength of light emitted from the light source or in the vicinity of the wavelength.

Examples of the sensitizing dyes, which can induce sensitivity to the wavelengths of visible to near infrared regions, include cyanines, phthalocyanines, merocyanines, porphyrins, spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, ketoalcohol borate complexes, and compounds disclosed in European Patent No. 568,993, U.S. Pat. Nos. 4,508,811 and 5,227,227, and JP-A Nos. 2001-125255 and 11-271969.

Examples in which the above polymerization initiators are used in combination with the sensitizing dye are disclosed in JP-A Nos. 2001-125255 and 11-271969.

It is preferred that the image formation layer contains a sensitizing dye in an amount providing a reflection density of from 0.1 to 1.2 at the printing plate material surface. The sensitizing dye content of the image formation layer greatly differs due to molar extinction coefficient of the sensitizing dye or crystallinity in the image formation layer of the sensitizing dye, and is ordinarily from 0.5 to 10% by weight.

The content of the photopolymerization initiator, the trihaloalkyl compound or the sensitizing dye in the image formation layer is preferably from 0.1 to 20% by weight, and more preferably from 3 to 12% by weight. The content of the photopolymerization initiator is from 30 to 55 parts by weight, that of the trihaloalkyl compound from 3 to 15 parts by weight, and that of the sensitizing dye from 40 to 67 parts by weight, each based on the 100 parts by weight of the total weight of the photopolymerization initiator, the trihaloalkyl compound and the sensitizing dye.

(Polymer Binder)

As the polymer binder used in the light sensitive layer can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof. The polymer binder is preferably a polyurethane resin or an acryl polymer.

As the polyurethane resin, there is a polyurethane resin with a substituent having acidic hydrogen as disclosed in JP-A No. 2001-117219, for example, a polyurethane resin having as a main skeleton a reaction product of diisocyanate and diol having a carboxyl group. As an alkali soluble polyurethane resin having a polymerizable double bond as a side chain, there is, for example, a reaction product of diisocyanate and diol having at least one ethylenically unsaturated bond as disclosed in JP-A No. 2001-125257. The alkali soluble polyurethane resin is preferably one having as a side chain a polymerizable double bond.

The polymer binder used in the invention is preferably a vinyl copolymer obtained by copolymerization of an acryl monomer, and more preferably a copolymer containing (a) a carboxyl group-containing monomer-unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic-acid with 2-hydroxymethacrylic acid.

Examples of the alkyl methacrylate or alkyl acrylate include an unsubstituted alkyl ester such as methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, dodecyl methacrylate, methyl acrylate, ethyl acrylate, propyl acrylate, butyl acrylate, amyl acrylate, hexyl acrylate, heptyl acrylate, octyl acrylate, nonyl acrylate, decyl acrylate, undecyl acrylate, or dodecyl acrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenyl acrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further, other monomer may be copolymerized with the above monomer.

The above-described vinyl polymers can be obtained by conventional solution polymerization, block polymerization or suspension polymerization.

The molecular weight of the obtained co-polymer can be controlled by selecting solvents for the reaction and reaction temperature.

The polymer binder used in the present invention is preferably a vinyl polymer having in the side chain a carboxyl group and a polymerizable double bond. As the polymer binder is also preferred an unsaturated bond-containing copolymer which is obtained by reacting a carboxyl group contained in the above vinyl copolymer molecule with for example, a compound having a (meth)acryloyl group and an epoxy group. Examples of the compound having a (meth)acryloyl group and an epoxy group in the molecule include glycidyl acrylate, glycidyl methacrylate and an epoxy group-containing unsaturated compound disclosed in JP-A No. 11-27196. Further, an unsaturated bond-containing copolymer which is obtained by reacting a hydroxyl group contained in the above vinyl copolymer molecule with for example, a compound having a (meth)acryloyl group and an isocyanate group. Examples of the compound having a (meth)acryloyl group and an isocyanate group in the molecule include vinyl isocyanate, (meth)acryl isocyanate, 2-(meth)acroyloxyethyl isocyanate, m- or p-isopropenyl-$\alpha$, $\alpha'$-dimethylbenzyl-isocyanate, and (meth)acryl isocyanate, or 2-(meth)acroyloxyethyl isocyanate is preferred.

A method for reacting a carboxyl group contained in the vinyl copolymer molecule with a compound having a (meth)acryloyl group and an epoxy group is carried out according to a well-known method.

Further, a method for reacting a carboxyl group contained in the vinyl copolymer molecule with a compound having a (meth)acryloyl group and an isocyanate group is carried out according to a well-known method.

The content of the vinyl polymer having in the side chain a carboxyl group and a polymerizable double bond is preferably from 50 to 100% by weight, and more preferably 100% by weight, based on the total weight of the polymer binder used.

The polymer binder content of the image formation layer is preferably from 10 to 90% by weight, more preferably from 15 to 70% by weight, and still more preferably from 20 to 50% by weight, in view of sensitivity.

(Addition Polymerizable Ethylenically Unsaturated Monomer Containing a Light Oxidizable Group)

The addition polymerizable ethylenically unsaturated monomer in the invention is preferably an addition polymerizable ethylenically unsaturated monomer containing a light oxidizable group. An addition polymerizable ethylenically unsaturated monomer containing both light oxidizable group and a urethane group is especially preferred. Examples of the light oxidizable group include a thio group, thioether group, a ureido group, an amino group, and an enol group, each of which may be a member constituting heterocycles. As moieties containing these groups, there are, for example, a triethanolamine moiety, a triphenylamine moiety, a thioureide moiety an imidazole moiety, an oxazole moiety, a thiazole moiety, an acetylacetone moiety, an N-phenylglycine moiety, and an ascorbic acid moiety. Preferred is an addition polymerizable monomer containing a tertiary amino group or a thioether group.

Exemplified compounds containing a light oxidizable group are listed in European Patent Publication Nos. 287,818, 353,389 and 364,735. Among the exemplified compounds, compounds containing a tertiary amino group, and a ureido group and/or a urethane group are preferred.

Examples of the addition polymerizable ethylenically unsaturated monomer containing both light oxidizable group and a urethane group are listed in Japanese Patent Publication No. 2669849, and JP-A Nos. 63-260909, 6-35189, and 2001-125255.

In the invention, a reaction product of a tertiary amine having two or more hydroxyl groups in the molecule, a diisocyanate and a compound having a hydroxyl group and an addition polymerizable ethylenically double bond in the molecule is preferably used.

The tertiary amine having two or more hydroxyl groups in the molecule has a hydroxyl group of preferably from 2 to 6, and more preferably from 2 to 4. Examples of the tertiary amine having two or more hydroxyl groups in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N, N', N'-tetra-2-hydroxyethylethylenediamine, N,N-bis (2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto. Examples of the compound having a hydroxyl group and an addition polymerizable ethylenically double bond in the molecule is not specifically limited, but 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate are preferred.

The reaction product can be synthesized according to the same method as a conventional method in which a urethane acrylate compound is ordinarily synthesized employing a diol, a diisocyanate and an acrylate having a hydroxyl group.

Examples of the reaction product of a tertiary amine having two or more hydroxyl groups in the molecule, a diisocyanate having an aromatic ring in the molecule and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

In addition to the above, acrylates or methacrylates disclosed in JP-A Nos. 1-105238 and 2-127404 can be used.

(Other Addition Polymerizable Ethylenically Unsaturated Monomer).

In the invention, another addition polymerizable ethylenically unsaturated monomer can be used with the monomers described above. As another addition polymerizable ethylenically unsaturated monomer, there are conventional radical polymerizable monomers, polyfunctional monomers having plural ethylenically unsaturated bond, and polyfunctional oligomers. Examples thereof include an acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate or EO-modified products thereof; and a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimelliticacid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethaneacrylate such as ethylene glycol•adipic acid•tolylenediisocyanate•2-hydroxyethylacrylate, polyethylene glycol•tolylenediisocyanate•2-hydroxyethylacrylate, hydroxyethylphthalyl methacrylate•xylenediisocyanate, 1,2-polybutadieneglycol•tolylenediisocyanate•2-hydroxyethylacrylate or trimethylolpropane•propylene glycol•tolylenediisocyanate•2-hydroxyethylacrylate, obtained by incorporating (meth)acrylic acid in an urethane resin; a silicone acrylate such as polysiloxane acrylate, or polysiloxane•diisocyanate•2-hydroxyethylacrylate; an alkyd modified acrylate obtained by incorporating a methacroyl group in an oil modified alkyd resin; and a spiran resin acrylate.

The planographic printing plate material of the invention can comprise a photopolymerizable light sensitive layer (hereinafter also referred to as light sensitive layer) as the image formation layer. Such an image formation layer can contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

As a monomer used in the image formation layer, there is a phosphate compound having at least one (meth)acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in JP-A Nos. 58-212994, 61-6649, 62-46688, 62-48589, 62-173295, 62-187092, 63-67189, and 1-244891, compounds described on pages. 286 to 294 of "11290 Chemical Compounds" edited by Kagakukogyo Nipposha, and compounds described on pages 11 to 65 of "UV•EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

The content of the ethylenically unsaturated monomers described above in the light sensitive layer is preferably from 1.0 to 80.0% by weight, and more preferably from 3.0 to 70.0% by weight.

(Compound Having a Cationically Polymerizable Group)

The image formation layer for the planographic printing plate material of the invention can further contain a compound having a cationically polymerizable group. Examples of the cationically polymerizable group, there are a group having a cyclic ether structure such as an oxirane ring, an oxetane ring or a dioxolane ring; and a group having an unsaturated ether structure such as vinyl ether or allyl ether. A compound having a cationically polymerizable group such as such as an oxirane ring, an oxetane ring or a dioxolane ring and a radically polymerizable group is especially preferred.

(Additives)

In the invention, the light sensitive layer may contain a hindered phenol compound, a hindered amine compound or other polymerization inhibitors in addition to the compounds described above, in order to prevent undesired polymerization of the ethylenically unsaturated monomer during the manufacture or storage of the planographic printing plate material.

Examples of the hindered phenol compound include 2,6-di-t-butyl-p-cresol, butylhydroxyanisole, 2,2'-methylenebis(4-methyl-6-t-butylphenol), 4,4'-butylidenebis(3-methyl-6-t-butylphenol), tetrakis-[methylene-3-(3',5'-t-butyl-4'-hydroxyphenyl)-propionate]methane, bis[3,3'-bis(4'-hydroxy-3'-t-butylphenyl)butyric acid]glycol ester, 2-t-butyl-6-(3-t-butyl-2-hydroy-5-methylbenzyl)-4-methylphenyl acrylate, and 2-[1-(2-hydroxy-3,5-di-t-pentylphenyl)ethyl]-4,6-di-t-pentylphenyl acrylate. Among them, 2-t-butyl-6-(3-t-butyl-2-hydroy-5-methylbenzyl)-4-methylphenyl acrylate and 2-[1-(2-hydroxy-3,5-di-t-pentylphenyl)ethyl]-4,6-di-t-pentylphenyl acrylate, each having a (meth)acryloyl group, are preferred.

Examples of the hindered amine compound include bis(1,2,2,6,6-pentamethyl-4-piperidyl)sebacate, bis(2,2,6,6-tetramethyl-4-piperidyl)sebacate, 1-[2-{3-(3,5-di-t-butyl-hydroxyphenyl)propionyloxy}ethyl]-4-[2-{3-(3,5-di-t-butyl-hydroxyphenyl)propionyloxy}ethyl]-2,2,6,6-tetramethylpiperidine, 4-benzoyloxy-2,2,6,6-tetramethylpiperidine, and 8-acetyl-3-dodecyl-7,7,9,9-tetramethyl-1,3,8-triazaspiro-[4.5]decane-2,4-dione.

Examples of another polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2;2'-methylenebis(4-methyl-6-t-butylphenol), N-nitrosophenylhydroxylamine cerous salt, and hindered amines such as 2,2,6,6-tetramethylpiperidine derivatives -butyl-6-(3-t-butyl-6-hydroxy-5-methylbenzyl)-4-methylphenyl acrylate.

The polymerization inhibitor content is preferably 0.01 to 5% by weight based on the total solid content of the light sensitive layer. Further, in order to prevent polymerization induced by oxygen, a higher fatty acid such as behenic acid or a higher fatty acid derivative such as behenic amide may be added to the light sensitive layer, or may be localized on the surface of the light sensitive layer in the course of drying after coating. The higher fatty acid or higher fatty acid derivative content is preferably 0.5 to 10% by weight based on the total solid content of the light sensitive layer.

The light sensitive layer can contain a colorant. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran".

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the light sensitive layer.

The light sensitive layer may contain a plasticizer in order to increase it adhesion to the support. Examples of the plasticizer include dimethyl phthalate, diethyl phthalate, dibutyl phthalate, diheptyl phthalate, di-2-ethylhexyl phthalate, di-n-octyl phthalate, didodecyl phthalate, diisodecyl phthalate, butylbenzyl phthalate, diisononyl phthalate, didodecyl phthalate, ethylphthalyl ethyl glycol, dimethyl isophthalate, triethylene glycol dicaprylate, dimethyl glycol phthalate, tricresyl phosphate, dioctyl adipate, dibutyl sebacate, and triacetyl glycerin. The plasticizer content of the light sensitive is preferably not more than 3% by weight, and more preferably from 0.1 to 2% by weight.

A coating liquid for the light sensitive layer can contain a surfactant as a coatability improving agent, as long as performance of the invention is not jeopardized. The surfactant is preferably a fluorine-contained surfactant.

A coating liquid for the light sensitive layer can contain an inorganic filler or a plasticizer such as dioctyl phthalate, dimethyl phthalate or tricresyl phosphate for improving a physical property of the light sensitive layer.

The content of the surfactant, filler or plasticizer is preferably not more than 10% by weight base on the total solid content of the coating.

(Coating)

The planographic printing plate material of the invention is obtained by preparing a coating liquid in which a light sensitive layer composition is dissolved in a solvent, coating the coating liquid on a support to form a light sensitive layer on the support.

The solvents used in the preparation of the coating liquid for the light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

The prepared coating liquid for the light sensitive layer is coated on a support according to a conventional method, and dried to obtain a planographic printing plate material. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

The drying temperature of a coated light sensitive layer is preferably from 60 to 160° C., more preferably from 80 to 140° C., and still more preferably from 90 to 120° C.

The thickness of the light sensitive layer is preferably from 0.5 to 5 g/m$^2$, and more preferably from 0.8 to 3 g/m$^2$.

(Protective Layer)

A protective layer is preferably provided on the light sensitive layer of the planographic printing plate material of the invention. It is preferred that the protective layer (oxygen shielding layer) is highly soluble in a developer (generally an alkaline solution) described later.

Materials constituting the protective layer are preferably polyvinyl alcohol, polysaccharide, polyvinyl pyrrolidone, polyethylene glycol, gelatin, glue, casein, hydroxyethyl cellulose, carboxymethyl cellulose, methyl cellulose, hydroxyethyl starch, gum arabic, sucrose octaacetate, ammonium alginate, sodium alginate, polyvinyl amine, polyethylene oxide, polystyrene sulfonic acid, polyacrylic acid, or a water soluble polyamide. These materials may be used alone or in combination. Especially preferred material is polyvinyl alcohol.

A coating liquid for the protective layer is obtained by dissolving the materials described above in a solvent. The coating liquid is coated on the light sensitive layer and dried to form a protective layer. The dry thickness of the protective layer is preferably from 0.1 to 5.0 µm, and more preferably from 0.5 to 3.0 µm. The protective layer may contain a surfactant or a matting agent.

The same coating method as described above in the light sensitive layer applies in the protective layer coating method. The drying temperature of the protective layer is preferably lower than that of the light sensitive layer. The former is preferably not less than 10° C. lower than that of the latter, and more preferably not less than 20° C. lower than that of the latter. The upper limit of the drying temperature is about 50° C.

Further, the drying temperature of the protective layer is preferably lower than a glass transition temperature (Tg) of the binder contained in the light sensitive layer. The drying temperature of the protective layer is preferably not less than 20° C. lower than Tg of the binder contained in the light sensitive layer, and more preferably not less than 40° C. lower than Tg of the binder contained in the light sensitive layer. The drying temperature of the protective layer is preferably at most 60° C. lower than Tg of the binder contained in the light sensitive layer.

(Image Formation Method)

The planographic printing plate material of the invention is imagewise exposed employing laser sources. The laser sources, for example, emitting a 350 to 450 nm laser available, are as follows.

A gas laser such as an Ar ion laser (364 nm and 351 nm), a Kr ion laser (356 nm, 351 nm), a He—Cd laser (441 nm), a solid laser such as a laser employing two of a combination of ND:YAG (YVO4) and SHG crystal (355 nm), or a laser employing a combination of Cr:LiSAF and SHG crystal (430 nm), a semiconductor laser such as KnbO$_3$, ring resonator (430 nm), a combination of a guiding wavelength conversion element, and AlGaAs, InGaAs semiconductor (300 to 450 nm), a combination of a guiding wavelength conversion element, and AlGaInP, InGaAs semiconductor (300 to 350 nm), AlGaInN (350 to 450 nm), and a pulse laser such as an N$_2$ laser (337 nm, pulse: 0.1 to 10 mJ) or an XeF laser (351 nm, pulse: 10 to 250 mJ).

The especially preferred one is an AlGaInN semiconductor laser (an InGaN type semiconductor laser available on the market, 400 to 410 nm), which is suitable in view of wavelength characteristics and cost performance. As a light source available emitting a 450 to 700 nm light, an Ar$^+$ laser (488 nm), a YAG-SHG laser (532 nm), an He—Ne laser (633 nm), or an Hd—Cd laser, or a red semiconductor laser (650 to 690 nm) can be used, and as a light source available emitting a 700 to 1200 nm light, a semiconductor laser (800 to 850 nm) or an Nd-YAG laser (1064 nm) can be used. Besides the above can be used a super high pressure, high pressure, intermediate pressure or low pressure mercury lamp, a chemical lamp, a carbon arc lamp, a xenon lamp, a metal halide lamp, an an ultraviolet laser lamp (an ArF excimer laser or a KrF excimer laser), and radiations such as electron beam, X-rays, ion beam or far infrared rays. The preferred are lasers emitting light with a wavelength of not less than 350 nm in view of cost performance.

A laser scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder, and the method of scanning on an inner surface of a cylinder are preferred in optical system accuracy and high density recording.

(Heating Treatment)

In the invention, heating treatment is preferably carried out after imagewise exposure, which increases the image formation speed and sensitivity and improves printing durability. The heating treatment method is not specifically limited, and non-contact heating, in which a heating means does not contact the image formation layer surface, is preferred. As the heating means, a conventional thermostat, a hot-air drying device, and an automatic developing machine available on the market installed with a heater can be used. The heating temperature is preferably from 100 to 130° C., in view of fog prevention, sensitivity, or printing durability. The heating time is preferably from 5 to 60 seconds, in view of fog prevention, sensitivity, or printing durability. Further, time taken from completion of imagewise exposure till when heating treating is carried out is preferably not more than 300 seconds.

(Development)

The exposed planographic printing plate material is developed with a developer. As the developer, a conventional alkali developer can be used. Examples of the developing solution include an alkali developing solution containing inorganic alkali agents such as sodium silicate, potassium silicate, ammonium silicate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide, and lithium hydroxide.

The developing solution may contain organic alkali agents such as monomethylamine, dimethylamine, trimethylamine, monoethylamine, diethylamine, triethylamine, monoisopropylamine, diisopropylamine, butylamine, monoethanolamine, diethanolamine, triethanolamine, monoisopropanolamine, diisopropanolamine, ethyleneimine, ethylenediamine, and pyridine.

These alkali agents can be used singly or in combination of two or more kinds thereof. The developing solution may optionally contain a surfactant such as an anionic surfactant, an amphoteric surfactant or alcohol.

The developer in the invention is preferably an aqueous solution, which has a silicate concentration of 1.0% by weight in terms of $SiO_2$, and has a pH of from 8.5 to 12.5. The aqueous solution may contain other additives. It is preferred that the aqueous solution further contains a surfactant in an amount of from 0.1 to 5.0% by weight. It is also preferred that the aqueous solution further contains the components described in the developing solution above.

(Automatic Developing Machine)

It is preferred that the automatic developing machine used invention comprises a means for replenishing a developer replenisher in a necessary amount; a means for discharging any excessive developer; a means for automatically replenishing water in necessary amounts; a means for detecting a transported planographic printing plate material; a means for calculating the area of the planographic printing plate precursor based on the detection; a means for controlling the replenishing amount of a developer replenisher, the replenishing amount of water to be replenished or the replenishing timing; a means for detecting a pH, temperature and/or electric conductivity of developer; or a means for controlling the replenishing amount of the developer replenisher, the replenishing amount of water to be replenished or the replenishing timing based on the detection. Washing water used for washing after development can be used as diluting water for diluting concentrated developer or concentrated developer replenisher.

The automatic developing machine used in the invention may have a pre-processing tank charged with a pre-processing solution upstream the developing means, in which a planographic printing plate material is immersed. It is preferred that this pre-processing tank is equipped with a spray for spraying the pre-processing solution onto the surface of a printing plate material, a means for controlling the temperature of the pre-processing solution to fall within the range of 25 to 55° C., and still more preferably a brush in the roll form for brushing the surface of the printing plate material. As the pre-processing solution, common water is preferably used.

(Post Processing)

The planographic printing plate material developed with the developer described above is subjected to post-processing. The post-processing step comprises post-processing the developed plate material with a post-processing solution such as washing water, a rinsing solution containing a surfactant, a finisher or a protective gumming solution containing gum arabic or starch derivatives as a main component. The post-processing step is carried out employing an appropriate combination of the post-processing solution described above. For example, a method is preferred in which a developed planographic printing plate material is post-washed with washing water, and then processed with a rinsing solution containing a surfactant, or a developed planographic printing plate material is post-washed with washing water, and then processed with a finisher, since it reduces fatigue of the rinsing solution or the finisher. It is preferred that a multi-step countercurrent processing is carried out employing a rinsing solution or a finisher. The post-processing is carried out employing an automatic developing machine having a development section and a post-processing section. In the post-processing step, the developed printing plate is sprayed with the post-processing solution from a spray nozzle or is immersed into the post-processing solution in a post-processing tank. A method is known in which supplies a small amount of water onto the developed printing plate material to wash the material, and reuses the water used for washing as a dilution water of a concentrated developer. In the automatic developing machine, a method is applied in which each processing solution is replenished with the respective processing replenisher according to the area of the printing plate material to have been processed or the operating time of the machine. A method (use-and-discard method) can be applied in which the developed material is processed with fresh processing solution and discarded. The thus obtained planographic printing plate is mounted on a printing press, and printing is carried out.

(Gumming Solution)

The gumming solution preferably contains an acid or a buffer so as to eliminate an alkali component of the developing solution. Further, it may contain a hydrophilic polymer compound, a chelating agent, a lubricating agent, an antiseptic agent or a solubilizing agent. When the gumming solution contains a hydrophilic polymer compound, it acts as a protective agent to prevent a scratch or a stain on the surface of the plate after development.

(Pre-Washing)

In the invention, the exposed planographic printing plate material before development is preferably pre-washed with washing water. The washing water is usually water, and may be an aqueous solution in which an additive is added to water.

In the invention, the planographic printing plate material may be developed immediately after pre-washed or after washed and dried. After development, the planographic printing plate material can be subjected to known post processing including washing, rinsing or gumming treatment. The used washing water before development can be reused in washing water to be used after development, a rinsing solution or a gumming solution.

(Printing)

Thus, the planographic printing plate material is subjected to the developing treatment described above to obtain a planographic printing plate with an image. The resulting planographic printing plate is mounted on a press, and then printing is carried out. In printing, a printing press, printing paper, printing ink and a dampening solution are not specifically limited. In recent years, printing ink containing no petroleum volatile organic-compound (VOC) has been developed and used in view of environmental concern. The present invention provides excellent effects in employing such a printing ink. Examples of such a printing ink include soybean oil ink "Naturalith 100" produced by Dainippon Ink Kagaku Kogyo Co., Ltd, VOC zero ink "TK HIGH ECO NV" produced by Toyo Ink Manufacturing Co., Ltd., and process ink "SOYSERVO" produced by Tokyo Ink Co., Ltd.

The soybean oil-based ink used in the invention contains soybean oil of from 1 to 20% by weight.

EXAMPLES

Next, the present invention will be explained employing examples, but the present invention is not limited thereto. In the examples, "parts" represents "parts by weight", unless otherwise specified.

Example 1

(Preparation of Supports 1 through 26)

A 0.3 mm thick aluminum plate (material 1052, containing not less than 99.3% of Al, 0.003% of Na, 0.020% of Mg, 0.08% of Si, 0.06% of Ti, 0.004% of Mn, 0.32% of Fe, 0.004% of Ni, 0.002% of Cu, 0.015% of Zn, 0.007% of Ga, and 0.001% of Cr) was degreased at 55° C. for 15 seconds in a 5% sodium hydroxide solution, washed with water, immersed at 25° C. for 10 seconds in a 10% nitric acid solution to neutralize, and then washed with water.

The resulting support was electrolytically surface roughened under conditions as shown in Table 1, employing a 60 Hz sinewave alternating current supply, or surface roughened with a brush under conditions described later, and then electrolytically surface-roughened.

In the electrolytically surface-roughening, the second electrolytically surface-roughening stage followed the first electrolytically surface-roughening stage, and standby time of 2 seconds was set between the first electrolytically surface-roughening stage and the second electrolytically surface-roughening stage. After the brush surface-roughening was carried out, the resulting support was immersed at 70° C. for 15 seconds in a 10% sodium hydroxide solution, immersed at 25° C. for 10 seconds in a 10% nitric acid solution, and then washed with water. After the electrolytically surface-roughening was carried out, the resulting support was immersed at 60° C. for 10 seconds in a 100 g/liter phosphoric acid solution to desmut, and then washed with water.

The surface roughened support was anodized in a 35° C. 200 g/liter sulfuric acid solution at a current density of 10 A/dm$^2$, employing a direct-current power source, and washed with water to form an anodization film with a thickness of 20 mg/dm$^2$.

Thus, supports 1 through 26 were prepared.

The control of an alternating current during the second stage of the electrolytic surface-roughening treatment was done by changing a current flow starting phase angle of a sine-wave curve by an arbitrary function generator HB-1 (produced by Hokuto Denko Co. Ltd.).

(Brush Surface-Roughening Condition A)

The brush surface-roughening was carried out as follows.

A running aluminum plate was surface roughened in a 20% by weight volcanic ash (#300) aqueous dispersion pressing a rotating nylon brush to the aluminum plate surface. In the surface-roughening, the support was passed one time on a line at a line speed of 5 m/minute at a brush push force of 20 mm, wherein the brush rotational direction was reverse to the support running direction, and the number of revolutions of the brush was 200 rpm.

TABLE 1

| | | First electrolytic surface-roughening | | | | | | | | | |
|---|---|---|---|---|---|---|---|---|---|---|---|
| | | Electrolyte solution | | | | | | AC flow Start | *6 | *7 | *8 | |
| *1 | *2 | *E (g/l) | *F (g/l) | *G (g/l) | *H (g/l) | *I (g/l) | *T (° C.) | Phase angle (°) | $D_1$ (A/dm$^2$) | $t_1$ (sec.) | $Q_1$ (C/dm$^2$) | Remarks |
| 1 | None | 11 | | 1 | 10 | | 30 | 0 | 50 | 9 | 450 | Inv. |
| 2 | None | 11 | | 1 | 10 | | 30 | 0 | 50 | 9 | 450 | Inv. |
| 3 | Yes | 11 | | 1 | 10 | | 30 | 0 | 50 | 9 | 450 | Inv. |
| 4 | None | 11 | | 1 | 10 | | 30 | 0 | 50 | 9 | 450 | Inv. |
| 5 | None | 11 | | 1 | 10 | | 30 | 0 | 50 | 12 | 600 | Inv. |

TABLE 1-continued

| | | | | | | | | | | | |
|---|---|---|---|---|---|---|---|---|---|---|---|
| 6 | None | 11 | | 1 | 10 | 30 | 0 | 50 | 9 | 450 | Inv. |
| 7 | None | 15 | | 1 | 10 | 30 | 0 | 65 | 11 | 715 | Inv. |
| 8 | None | 15 | | 1 | 10 | 30 | 0 | 65 | 11 | 715 | Inv. |
| 9 | None | 11 | | 1 | 10 | 30 | 0 | 50 | 6 | 300 | Inv. |
| 10 | None | 11 | | 1 | 10 | 30 | 0 | 50 | 16 | 800 | Inv. |
| 11 | None | 11 | | 1 | 10 | 30 | 0 | 50 | 5 | 250 | Inv. |
| 12 | None | 11 | | 1 | 10 | 30 | 0 | 50 | 16 | 800 | Inv. |
| 13 | None | 4 | | 1 | 10 | 30 | 0 | 50 | 9 | 450 | Inv. |
| 14 | None | 21 | | 1 | 10 | 30 | 0 | 50 | 9 | 450 | Inv. |
| 15 | None | 11 | | | 10 | 30 | 0 | 50 | 9 | 450 | Inv. |
| 16 | None | 11 | | 16 | 10 | 30 | 0 | 50 | 9 | 450 | Inv. |
| 17 | None | 11 | | 1 | | 30 | 0 | 50 | 9 | 450 | Inv. |
| 18 | None | 11 | | 1 | 21 | 30 | 0 | 50 | 9 | 450 | Inv. |
| 19 | None | 11 | | 1 | 10 | 36 | 0 | 50 | 9 | 450 | Inv. |
| 20 | None | 11 | | 1 | 10 | 30 | 0 | 50 | 9 | 450 | Comp. |
| 21 | None | 11 | | 1 | 10 | 30 | 0 | 50 | 9 | 450 | Comp. |
| 22 | None | 11 | | 1 | 10 | 30 | 0 | 50 | 18 | 900 | Comp. |
| 23 | None | 11 | | 1 | 10 | 30 | 90 | 50 | 18 | 900 | Comp. |
| 24 | None | 11 | | 1 | 10 | 30 | 90 | 50 | 9 | 450 | Comp. |
| 25 | None | | 11 | 1 | 10 | 30 | 0 | 50 | 9 | 450 | Comp. |
| 26 | None | | 11 | 1 | 10 | 30 | 0 | 50 | 12 | 600 | Comp. |

| | Second electrolytic surface-roughening | | | | | | | | | | | |
|---|---|---|---|---|---|---|---|---|---|---|---|---|
| | Electrolyte solution | | | | | | AC flow Start Phase | *6 | *7 | *8 | | |
| *1 | *E (g/l) | *F (g/l) | *G (g/l) | *H (g/l) | *I (g/l) | *T (° C.) | angle (°) | $D_2$ (A/dm²) | $t_2$ (sec.) | $Q_2$ (C/dm²) | $t_1/t_2$ | Q ($Q_1 + Q_2$) | Remarks |
| 1 | 11 | | 1 | 10 | | 30 | 60 | 50 | 9 | 450 | 1.0 | 900 | Inv. |
| 2 | 11 | | 1 | 10 | | 30 | 90 | 50 | 9 | 450 | 1.0 | 900 | Inv. |
| 3 | 11 | | 1 | 10 | | 30 | 90 | 50 | 9 | 450 | 1.0 | 900 | Inv. |
| 4 | 11 | | 1 | 10 | | 30 | 120 | 50 | 9 | 450 | 1.0 | 900 | Inv. |
| 5 | 11 | | 1 | 10 | | 30 | 90 | 50 | 6 | 300 | 2.0 | 900 | Inv. |
| 6 | 11 | | 1 | | 10 | 30 | 90 | 50 | 9 | 450 | 1.0 | 900 | Inv. |
| 7 | 15 | | 1 | 10 | | 30 | 60 | 25 | 7 | 175 | 1.6 | 890 | Inv. |
| 8 | 11 | | 1 | 10 | | 30 | 60 | 25 | 7 | 175 | 1.6 | 890 | Inv. |
| 9 | 11 | | 1 | 10 | | 30 | 90 | 50 | 12 | 600 | 0.5 | 900 | Inv. |
| 10 | 11 | | 1 | 10 | | 30 | 90 | 50 | 2 | 100 | 8.0 | 900 | Inv. |
| 11 | 11 | | 1 | 10 | | 30 | 90 | 50 | 5 | 250 | 1.0 | 500 | Inv. |
| 12 | 11 | | 1 | 10 | | 30 | 90 | 50 | 16 | 800 | 1.0 | 1600 | Inv. |
| 13 | 4 | | 1 | 10 | | 30 | 90 | 50 | 9 | 450 | 1.0 | 900 | Inv. |
| 14 | 21 | | 1 | 10 | | 30 | 90 | 50 | 9 | 450 | 1.0 | 900 | Inv. |
| 15 | 11 | | | 10 | | 30 | 90 | 50 | 9 | 450 | 1.0 | 900 | Inv. |
| 16 | 11 | | 16 | 10 | | 30 | 90 | 50 | 9 | 450 | 1.0 | 900 | Inv. |
| 17 | 11 | | 1 | | | 30 | 90 | 50 | 9 | 450 | 1.0 | 900 | Inv. |
| 18 | 11 | | 1 | 21 | | 30 | 90 | 50 | 9 | 450 | 1.0 | 900 | Inv. |
| 19 | 11 | | 1 | 10 | | 36 | 90 | 50 | 9 | 450 | 1.0 | 900 | Inv. |
| 20 | 11 | | 1 | 10 | | 30 | 55 | 50 | 9 | 450 | 1.0 | 900 | Comp. |
| 21 | 11 | | 1 | 10 | | 30 | 125 | 50 | 9 | 450 | 1.0 | 900 | Comp. |
| 22 | | | | | | | | | | | | 900 | Comp. |
| 23 | | | | | | | | | | | | 900 | Comp. |
| 24 | 11 | | 1 | 10 | | 30 | 0 | 50 | 9 | 450 | 1.0 | 900 | Comp. |
| 25 | | 11 | 1 | 10 | | 30 | 60 | 50 | 9 | 450 | 1.0 | 900 | Comp. |
| 26 | 11 | | 1 | 10 | | 30 | 0 | 50 | 9 | 300 | 2.0 | 900 | Comp. |

Inv.: Inventive,
Comp.: Comparative,
AC flow start phase angle 0° is a Sine-wave In Table 1, "*1" represents support, "*2" brush surface-roughening treatment A described above, "*E" hydrochloric acid, "*F" nitric acid, "*G" aluminum ion concentration (g/l), "*H" acetic acid, "*I" boric acid, "*T" temperature, "*6" current density, "*7" electrolytic time, and "*8" quantity of electricity.

(Preparation of Photopolymer Type Planographic Printing Plate Material Samples 1 Through 26 for a FD-YAG Laser (532 nm) Source)

Each of the resulting supports 1 through 26 was immersed in an aqueous 0.44% polyvinyl phosphonic acid solution at 75° C. for 30 seconds, washed with distilled water, and dried with 25° C. air.

Then, the following photopolymerizable light sensitive layer coating solution was coated on the resulting support through a wire bar, and dried at 95° C. for 1.5 minutes to give a light sensitive layer having a dry thickness of 1.5 g/m². After that, the following protective layer coating solution was coated on the photopolymerizable light sensitive layer using an applicator, and dried at 75° C. for 1.5 minutes to give a protective layer with a dry thickness of 2.0 g/m². Thus, planographic printing plate material samples with the protective layer were prepared.

| (Photopolymerizable light sensitive layer coating solution) | |
|---|---|
| Polymer binder B-1 | 40.0 parts |
| Mixture of sensitizing dyes D-1 and D-2 as shown below (1:1) | 3.0 parts |
| Photopolymerization initiator, η-cumene-(η-cyclopentadienyl)iron hexafluorophosphate | 4.0 parts |
| Addition polymerizable ethylenically unsaturated monomer M-3 (described previously) | 40.0 parts |
| Addition polymerizable ethylenically unsaturated monomer NK ESTER G (polyethylene glycol, produced by Shinnakamura Kagaku Co., Ltd.) | 15.0 parts |
| Hindered amine compound (LS-770 produced by Sankyo Co., Ltd.) | 0.1 parts |
| Trihaloalkyl compound E-1 shown below | 1.0 part |
| Phthalocyanine pigment (MHI #454 produced by Mikuni Sikisosha) | 4.0 parts |
| Fluorine-contained surfactant (F-178K produced by Dainippon Ink Kagaku Kogyo Co., Ltd.) | 0.5 parts |
| Methyl ethyl ketone | 80 parts |
| Cyclohexanone | 820 parts |

(Synthesis of Polymer Binder B-1)

125 parts (1.25 mol) of methyl methacrylate, 12 parts (0.1 mol) of ethyl methacrylate, 63 parts (0.73 mol) of methacrylic acid, 240 parts of cyclohexanone, 160 parts of isopropyl alcohol, and 5 parts of α,α'-azobisisobutyro-nitrile were put in a three neck flask under nitrogen atmosphere, and reacted under nitrogen atmosphere for 6 hours at 80° C. in an oil bath. After that, 4 parts of triethylbenzylammonium chloride and 52 parts (0.73 mol) of glycidyl methacrylate were further added to the mixture, and reacted at 25° C. for 3 hours. Thus, polymer binder B-1 was obtained. The weight average molecular weight of the polymer binder B-1 was 55,000 (in terms of polystyrene), measured according to GPC.

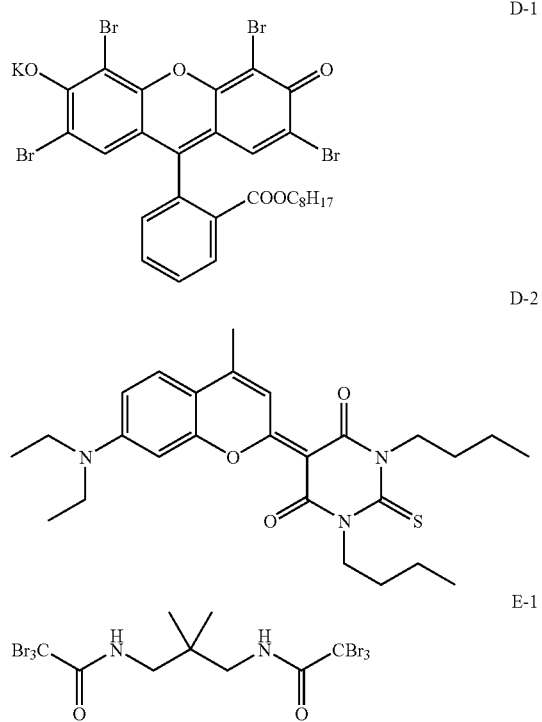

| (Protective layer coating solution) | |
|---|---|
| Polyvinyl alcohol (GL-05, produced by Nippon Gosei Kagaku Co., Ltd.) | 84 parts |
| Polyvinyl pyrrolidone (K-30, produced by ISP Japan Co., Ltd.) | 15 parts |
| Surfactant (SURFINOL 465, produced by Nisshin Kagaku Kogyo Co., Ltd.) | 0.5 parts |
| Water | 900 parts |

(Image Formation)

The planographic printing plate material sample obtained above was imagewise exposed at an exposure of 200 μJ/cm² and at a resolving degree of 2400 dpi, employing a CTP exposure device TIGERCAT (produced by ECRM Co., Ltd.) in which a FD-YAG laser was installed to obtain an image with a screen number of 175. Herein, dpi represents the dot numbers per 2.54 cm. The image pattern used for the exposure comprised a solid image and a dot image with 1 to 99% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample, a pre-washing section for removing the protective layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate samples 1 through 24 were obtained. Herein, preheating was carried out at a surface temperature of 115° C. for 15 seconds. Time taken from completion of exposure till to arrival at the preheating section was within 30 seconds.

| <Developer composition> | |
|---|---|
| Potassium silicate solution (containing 26% by weight of SiO$_2$ and 13.5% by weight of K$_2$O) | 40.0 g/liter |
| Potassium hydroxide | 4.0 g/liter |
| Ethylenediaminetetraacetic acid | 0.5 g/liter |
| Sodiumsulfo-polyoxyethylene (13) naphthyl ether | 20.0 g/liter |

Water was added to make a 1 liter developer. PH of the developer was 12.3.

(Printing Method)

The planographic printing plate material sample was imagewise exposed and developed as above to obtain a planographic printing plate sample. Employing the resulting printing plate sample, printing was carried out on a press (DAIYA1F-1 produced by Mitsubishi Jukogyo Co., Ltd.), wherein a coat paper, printing ink (soybean oil-based ink "Naturalist 100" produced by Dainippon Ink Kagaku Kogyo Co., Ltd.), and dampening-water (SG-51, H solution produced by Tokyo Ink Co., Ltd., Concentration: 1.5%) were used.

(Small Dot Reproduction)

One hundred copies were printed, and the smallest dot area (represented in terms of percent) reproduced on the prints was evaluated as a measure of small dot reproduction. The less the smallest area reproduced is, the better the small dot reproduction.

(Printing Durability)

The number of prints printed from the beginning of the printing till when the 5% dot area was not reproduced was evaluated as a measure of printing durability. The more the number is, the higher the printing durability.

(Water Tolerance)

Printing was carried out varying a dampening solution amount supplied to a printing plate wherein the supply amount is varied by controlling the rotational speed of the water fountain roller of the printing press. In the invention, the rotational speed of the water fountain roller was controlled-through a controller of the printing press in which a dampening solution supply amount was graduated in (from 1 to 99) %. The highest rotational speed of the water fountain roller, at which stain occurred at non-image portions of the prints, and the lowest rotational speed of the water fountain roller, at which the magenta ink density lowered to 1.45 at image portions of the prints, were determined. The magenta ink density was measured through a reflection densitometer GretagMacbeth (produced by Macbeth Co., Ltd.). The former was evaluated as a measure of ease with which a dampening solution supply could be reduced, and a difference between the former and the latter (hereinafter referred to also as rotational speed difference) was evaluated as a measure of water tolerance. When the highest rotational speed of the water fountain roller, at which stain occurred at non-image portions of the prints, is lower, a dampening solution supply can be more easily reduced, which provides advantageous result. When the difference is larger, a dampening solution y can be more easily controlled, which provides wider tolerance.

The results are shown in Table 2.

TABLE 2

| Printing plate No. | Support No. | Smallest dot area reproduced (%) | Printing durability (Number) | *1 (%) | *2 (%) | Rotational speed difference *2 − *1 (%) | Remarks |
|---|---|---|---|---|---|---|---|
| 1 | 1 | 2 | 400000 | 21 | 47 | 26 | Inv. |
| 2 | 2 | 2 | 400000 | 21 | 47 | 26 | Inv. |
| 3 | 3 | 2 | 400000 | 21 | 47 | 26 | Inv. |
| 4 | 4 | 2 | 400000 | 21 | 47 | 26 | Inv. |
| 5 | 5 | 2 | 400000 | 21 | 47 | 26 | Inv. |
| 6 | 6 | 2 | 400000 | 21 | 47 | 26 | Inv. |
| 7 | 7 | 2 | 400000 | 21 | 47 | 26 | Inv. |
| 8 | 8 | 2 | 400000 | 21 | 47 | 26 | Inv. |
| 9 | 9 | 3 | 400000 | 22 | 47 | 25 | Inv. |
| 10 | 10 | 3 | 350000 | 22 | 47 | 25 | Inv. |
| 11 | 11 | 3 | 350000 | 22 | 46 | 24 | Inv. |
| 12 | 12 | 3 | 350000 | 23 | 47 | 24 | Inv. |
| 13 | 13 | 3 | 350000 | 22 | 46 | 24 | Inv. |
| 14 | 14 | 3 | 350000 | 22 | 46 | 24 | Inv. |
| 15 | 15 | 3 | 350000 | 22 | 46 | 24 | Inv. |
| 16 | 16 | 3 | 350000 | 22 | 46 | 24 | Inv. |
| 17 | 17 | 4 | 350000 | 23 | 46 | 23 | Inv. |
| 18 | 18 | 4 | 350000 | 23 | 46 | 23 | Inv. |
| 19 | 19 | 4 | 350000 | 23 | 46 | 23 | Inv. |
| 20 | 20 | 4 | 200000 | 25 | 44 | 19 | Comp. |
| 21 | 21 | 4 | 200000 | 27 | 46 | 19 | Comp. |
| 22 | 22 | 5 | 200000 | 27 | 45 | 18 | Comp. |
| 23 | 23 | 4 | 150000 | 25 | 46 | 21 | Comp. |
| 24 | 24 | 4 | 100000 | 25 | 46 | 21 | Comp. |
| 25 | 25 | 3 | 200000 | 27 | 45 | 18 | Comp. |
| 26 | 26 | 4 | 100000 | 25 | 46 | 21 | Comp. |

Inv.: Invention.,
Comp.: Comparative
"*1" represents the highest rotational speed of the water fountain roller at which stain occurred at non-image portions of prints.
"*2" represents the lowest rotational speed of the water fountain roller at which ink density lowered at image portions of prints.

As is apparent from Table 2 above, inventive planographic printing plate material samples provide excellent small dot reproduction, excellent printing durability and excellent water tolerance.

(Preparation of Photopolymer Type Planographic Printing Plate Material Samples 27 Through 52 for a Violet Light)

Each of the resulting support was immersed in an aqueous 0.44% polyvinyl phosphonic acid solution at 75° C. for 30 seconds, washed with distilled water, and dried with 25° C. air.

Then, the following photopolymerizable light sensitive layer coating solution was coated on the resulting support through a wire bar, and dried at 95° C. for 1.5 minutes to give a light sensitive layer having a dry thickness of 1.5 g/m². After that, the protective layer coating solution described above was coated on the photopolymerizable light sensitive layer using an applicator, and dried at 75° C. for 1.5 minutes to give a protective layer with a dry thickness of 2.0 g/m². Thus, planographic printing plate material samples with the protective layer were prepared.

| (Photopolymerizable light sensitive layer coating solution) | |
| --- | --- |
| Polymer binder B-1 | 40.0 parts |
| Photopolymerization initiator, η-cumene-(η-cyclopentadienyl)iron hexafluorophosphate | 3.0 parts |
| Mixture of sensitizing dyes D-3 and D-4 as shown below (1:1) | 4.0 parts |
| Addition polymerizable ethylenically unsaturated monomer M-3 (described above) | 40.0 parts |
| Addition polymerizable ethylenically unsaturated monomer NK ESTER G (polyethylene glycol dimethacrylate, produced by Shinnakamura Kagaku Co., Ltd.) | 7.0 parts |
| Cationically polymerizable monomer C-1 as shown below | 8.0 parts |
| Hindered amine compound (LS-770 produced by Sankyo Co., Ltd.) | 0.1 parts |
| Trihaloalkyl compound E-1 described above | 5.0 part |
| Phthalocyanine pigment (MHI #454 produced by Mikuni Sikisosha) | 7.0 parts |
| Fluorine-contained surfactant (F-178K produced by Dainippon Ink Kagaku Kogyo Co., Ltd.) | 0.5 parts |
| Methyl ethyl ketone | 80 parts |
| Cyclohexanone | 820 parts |

D-3

D-4

C-1

(Image Formation)

Employing a plate setter Tigercat (produced by ECRM Co., Ltd.), in which a 408 nm laser with an output power of 30 mW was installed, the planographic printing plate material sample obtained above was imagewise exposed at an exposure of 50 μJ/cm² and at a resolving degree of 2400 dpi to obtain an image with a screen number of 175. The image pattern used for the exposure comprised a solid image and a dot image with 1 to 99% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample, a pre-washing section for removing the protective layer before development, a development section charged with the developer described above, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate samples 27 through 52 were obtained. Herein, preheating was carried out at a surface temperature of 115° C. for 15 seconds. Time taken from completion of exposure till to arrival at the preheating section was within 30 seconds.

(Printing Method, Small Dot Reproduction, Printing Durability, and Water Tolerance)

Printing was carried out in the same manner as above, and small dot reproduction, printing durability and water tolerance were evaluated according to the same method as described above. The results are shown in Table 3.

TABLE 3

| Printing plate No. | Support No. | Smallest dot area reproduced (%) | Printing durability (Number) | *1 (%) | *2 (%) | Rotational speed difference *2 − *1 (%) | Remarks |
| --- | --- | --- | --- | --- | --- | --- | --- |
| 27 | 1 | 3 | 300000 | 21 | 47 | 26 | Inv. |
| 28 | 2 | 3 | 300000 | 21 | 47 | 26 | Inv. |
| 29 | 3 | 3 | 300000 | 21 | 47 | 26 | Inv. |
| 30 | 4 | 3 | 300000 | 21 | 47 | 26 | Inv. |
| 31 | 5 | 3 | 300000 | 21 | 47 | 26 | Inv. |
| 32 | 6 | 3 | 300000 | 21 | 47 | 26 | Inv. |
| 33 | 7 | 3 | 300000 | 22 | 47 | 25 | Inv. |
| 34 | 8 | 3 | 300000 | 22 | 47 | 25 | Inv. |
| 35 | 9 | 4 | 300000 | 22 | 47 | 25 | Inv. |
| 36 | 10 | 4 | 250000 | 22 | 47 | 25 | Inv. |
| 37 | 11 | 4 | 250000 | 22 | 47 | 25 | Inv. |

TABLE 3-continued

| Printing plate No. | Support No. | Smallest dot area reproduced (%) | Printing durability (Number) | *1 (%) | *2 (%) | Rotational speed difference *2 − *1 (%) | Remarks |
|---|---|---|---|---|---|---|---|
| 38 | 12 | 4 | 250000 | 22 | 47 | 25 | Inv. |
| 39 | 13 | 4 | 200000 | 22 | 47 | 25 | Inv. |
| 40 | 14 | 4 | 200000 | 26 | 47 | 21 | Inv. |
| 41 | 15 | 4 | 200000 | 25 | 44 | 19 | Inv. |
| 42 | 16 | 4 | 200000 | 25 | 46 | 21 | Inv. |
| 43 | 17 | 5 | 200000 | 25 | 46 | 21 | Inv. |
| 44 | 18 | 5 | 200000 | 25 | 46 | 21 | Inv. |
| 45 | 19 | 5 | 200000 | 25 | 46 | 21 | Inv. |
| 46 | 20 | 5 | 100000 | 26 | 44 | 18 | Comp. |
| 47 | 21 | 5 | 100000 | 27 | 46 | 19 | Comp. |
| 48 | 22 | 6 | 100000 | 27 | 45 | 18 | Comp. |
| 49 | 23 | 5 | 75000 | 25 | 46 | 21 | Comp. |
| 50 | 24 | 5 | 75000 | 25 | 46 | 21 | Comp. |
| 51 | 25 | 4 | 100000 | 25 | 46 | 21 | Comp. |
| 52 | 26 | 5 | 50000 | 25 | 46 | 21 | Comp. |

Inv.: Invention.,
Comp.: Comparative
"*1" represents the highest rotational speed of the water fountain roller at which stain occurred at non-image portions of prints.
"*2" represents the lowest rotational speed of the water fountain roller at which ink density lowered at image portions of prints.

As is apparent from Table 3 above, inventive graphic printing plate material samples provide excellent small dot reproduction, excellent printing durability and excellent water tolerance.

(Preparation of Photopolymer Type Planographic Printing Plate Material Samples 53 Through 78 for an Infrared Laser (830 nm) Source)

Each of the resulting supports 1 through 26 was immersed in an aqueous 0.44% polyvinyl phosphonic acid solution at 75° C. for 30 seconds, washed with distilled water, and dried with 25° C. air.

Then, the following photopolymerizable light sensitive layer coating solution was coated on the resulting support through a wire bar, and dried at 95° C. for 1.5 minutes to give a light sensitive layer having a dry thickness of 1.5 g/m². After that, the protective layer coating solution described above was coated on the photopolymerizable light sensitive layer using an applicator, and dried at 75° C. for 1.5 minutes to give a protective layer with a dry thickness of 2.0 g/m². Thus, planographic printing plate material samples with the protective layer were prepared.

| (Photopolymerizable light sensitive layer coating solution) | |
|---|---|
| Polymer binder B-1 describe above | 40.0 parts |
| Infrared absorbing dye D-5 shown below | 2.5 parts |
| N-Phenylglycine benzyl ester | 4.0 parts |
| Addition polymerizable ethylenically unsaturated monomer M-3 (described above) | 40.0 parts |
| Addition polymerizable ethylenically unsaturated monomer NK ESTER G (polyethylene glycol dimethacrylate, produced by Shinnakamura Kagaku Co., Ltd.) | 7.0 parts |
| Cationically polymerizable monomer C-1 as shown below | 8.0 parts |
| Hindered amine compound (LS-770 produced by Sankyo Co., Ltd.) | 0.1 parts |
| Trihaloalkyl compound E-1 described above | 5.0 part |
| Phthalocyanine pigment (MHI #454 produced by Mikuni Sikisosha) | 7.0 parts |
| Fluorine-contained surfactant (F-178K produced by Dainippon Ink Kagaku Kogyo Co., Ltd.) | 0.5 parts |

-continued

| (Photopolymerizable light sensitive layer coating solution) | |
|---|---|
| Methyl ethyl ketone | 80 parts |
| Cyclohexanone | 820 parts |

D-5

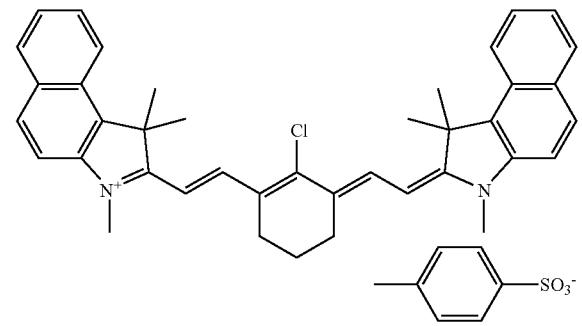

(Image Formation)

Employing a plate setter TREND SETTER 3244 (produced by Creo Co., Ltd.), in which a 830 nm laser was installed, the planographic printing plate material sample obtained above was imagewise exposed at an exposure of 200 mJ/cm² and at a resolving degree of 2400 dpi to obtain an image with a screen number of 175. The image pattern used for the exposure comprised a solid image and a dot image with 1 to 99% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample, a pre-washing section for removing the protective layer before development, a development section charged with the developer described above, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate samples 53 through 78 were obtained. Herein, preheating was carried out at a surface temperature of 115° C. for 15 seconds. Time taken from completion of exposure till to arrival at the preheating section was within 30 seconds.

(Printing Method, Small Dot Reproduction, Printing Durability, and Water Tolerance)

Printing was carried out in the same manner as above, and small dot reproduction, printing durability and water tolerance were evaluated according to the same method as described above. The results are shown in Table 4.

| (Light sensitive layer coating solution) | |
| --- | --- |
| Novolac resin (m-cresol-p-cresol (60/40) novolac resin containing having an unreacted cresol content of 0.5% by weight and a weight average molecular weight of 7,000) | 1.0 part |
| Infrared absorbing dye D-5 described above | 0.1 parts |
| Tetrahydrophthalic anhydride | 0.05 parts |
| p-Toluene sulfonic acid | 0.002 parts |
| Ethyl violet in which Cl⁻ was substituted with 6-hydroxy-β-naphthalene sulfonate ion | 0.02 parts |

TABLE 4

| Printing plate No. | Support No. | Smallest dot area reproduced (%) | Printing durability (Number) | *1 (%) | *2 (%) | Rotational speed difference *2 − *1 (%) | Remarks |
| --- | --- | --- | --- | --- | --- | --- | --- |
| 53 | 1 | 2 | 350000 | 21 | 47 | 26 | Inv. |
| 54 | 2 | 2 | 350000 | 21 | 47 | 26 | Inv. |
| 55 | 3 | 2 | 350000 | 21 | 47 | 26 | Inv. |
| 56 | 4 | 2 | 350000 | 21 | 47 | 26 | Inv. |
| 57 | 5 | 2 | 350000 | 21 | 47 | 26 | Inv. |
| 58 | 6 | 3 | 350000 | 21 | 47 | 26 | Inv. |
| 59 | 7 | 3 | 350000 | 21 | 47 | 26 | Inv. |
| 60 | 8 | 3 | 350000 | 21 | 47 | 26 | Inv. |
| 61 | 9 | 3 | 350000 | 22 | 47 | 25 | Inv. |
| 62 | 10 | 3 | 300000 | 22 | 47 | 25 | Inv. |
| 63 | 11 | 3 | 300000 | 22 | 47 | 25 | Inv. |
| 64 | 12 | 3 | 300000 | 23 | 47 | 24 | Inv. |
| 65 | 13 | 3 | 250000 | 22 | 47 | 25 | Inv. |
| 66 | 14 | 4 | 250000 | 22 | 47 | 25 | Inv. |
| 67 | 15 | 4 | 250000 | 22 | 44 | 22 | Inv. |
| 68 | 16 | 4 | 250000 | 22 | 46 | 24 | Inv. |
| 69 | 17 | 4 | 250000 | 23 | 46 | 23 | Inv. |
| 70 | 18 | 4 | 250000 | 23 | 46 | 23 | Inv. |
| 71 | 19 | 4 | 250000 | 23 | 46 | 23 | Inv. |
| 72 | 20 | 4 | 150000 | 25 | 44 | 19 | Comp. |
| 73 | 21 | 4 | 150000 | 27 | 46 | 19 | Comp. |
| 74 | 22 | 3 | 150000 | 27 | 45 | 18 | Comp. |
| 75 | 23 | 4 | 100000 | 25 | 46 | 21 | Comp. |
| 76 | 24 | 4 | 100000 | 25 | 46 | 21 | Comp. |
| 77 | 25 | 4 | 150000 | 27 | 46 | 19 | Comp. |
| 78 | 26 | 4 | 50000 | 25 | 46 | 21 | Comp. |

Inv.: Invention.,
Comp.: Comparative
"*1" represents the highest rotational speed of the water fountain roller at which stain occurred at non-image portions of prints.
"*2" represents the lowest rotational speed of the water fountain roller at which ink density lowered at image portions of prints.

As is apparent from Table 4 above, inventive planographic printing plate material samples provide excellent small dot reproduction, excellent printing durability and excellent water tolerance.

(Preparation of Positive Working Planographic Printing Plate Material Samples 79 Through 104 for an Infrared Laser (830 nm) Source)

Each of the resulting supports 1 through 26 was immersed in an aqueous 0.44% polyvinyl phosphonic acid solution at 75° C. for 30 seconds, washed with distilled water, and dried with 25° C. air. Then, the following light sensitive layer coating solution was coated on the resulting support through a wire bar, and dried at 95° C. for 1.5 minutes to give a light sensitive layer having a dry thickness of 1.5 g/m². Thus, planographic printing plate material samples were prepared.

| -continued | |
| --- | --- |
| (Light sensitive layer coating solution) | |
| Fluorine-contained surfactant (F-178K produced by Dainippon Ink Kagaku Kogyo Co., Ltd.) | 0.5 parts |
| Methyl ethyl ketone | 12 parts |

(Image Formation)

Employing a plate setter TREND SETTER 3244 (produced by Creo Co., Ltd.), in which a 830 nm laser was installed, the planographic printing plate material sample obtained above was imagewise exposed at an exposure of 150 mJ/cm² and at a resolving degree of 2400 dpi to obtain an image with a screen number of 175. The image pattern used for the exposure comprised a solid image and a dot image with 1 to 99% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample, a pre-washing section for removing the protective layer before development, a development section charged with the following Water was added to make a 1 liter developer.

(Printing Method, Small Dot Reproduction, Printing Durability, and Water Tolerance)

Printing was carried out in the same manner as above, and small dot reproduction, printing durability and water tolerance were evaluated according to the same method as described above. The results are shown in Table 5.

TABLE 5

| Printing plate No. | Support No. | Smallest dot area reproduced (%) | Printing durability (Number) | *1 (%) | *2 (%) | Rotational speed difference *2 − *1 (%) | Remarks |
|---|---|---|---|---|---|---|---|
| 79 | 1 | 3 | 200000 | 21 | 45 | 24 | Inv. |
| 80 | 2 | 3 | 200000 | 21 | 45 | 24 | Inv. |
| 81 | 3 | 3 | 200000 | 21 | 45 | 24 | Inv. |
| 82 | 4 | 3 | 200000 | 21 | 45 | 24 | Inv. |
| 83 | 5 | 3 | 200000 | 21 | 45 | 24 | Inv. |
| 84 | 6 | 3 | 200000 | 21 | 45 | 24 | Inv. |
| 85 | 7 | 3 | 200000 | 21 | 45 | 24 | Inv. |
| 86 | 8 | 3 | 200000 | 21 | 45 | 24 | Inv. |
| 87 | 9 | 4 | 200000 | 22 | 45 | 23 | Inv. |
| 88 | 10 | 4 | 150000 | 22 | 45 | 23 | Inv. |
| 89 | 11 | 4 | 150000 | 22 | 45 | 23 | Inv. |
| 90 | 12 | 4 | 150000 | 23 | 45 | 22 | Inv. |
| 91 | 13 | 4 | 100000 | 22 | 45 | 23 | Inv. |
| 92 | 14 | 4 | 100000 | 22 | 45 | 23 | Inv. |
| 93 | 15 | 4 | 100000 | 22 | 42 | 20 | Inv. |
| 94 | 16 | 4 | 100000 | 22 | 44 | 22 | Inv. |
| 95 | 17 | 5 | 100000 | 23 | 44 | 21 | Inv. |
| 96 | 18 | 5 | 100000 | 23 | 44 | 21 | Inv. |
| 97 | 19 | 5 | 100000 | 23 | 44 | 21 | Inv. |
| 98 | 20 | 5 | 75000 | 25 | 42 | 17 | Comp. |
| 99 | 21 | 5 | 75000 | 27 | 44 | 17 | Comp. |
| 100 | 22 | 6 | 75000 | 27 | 43 | 16 | Comp. |
| 101 | 23 | 5 | 50000 | 25 | 44 | 19 | Comp. |
| 102 | 24 | 5 | 70000 | 25 | 44 | 19 | Comp. |
| 103 | 25 | 4 | 75000 | 27 | 44 | 17 | Comp. |
| 104 | 26 | 5 | 35000 | 25 | 44 | 19 | Comp. |

Inv.: Invention.,
Comp.: Comparative
"*1" represents the highest rotational speed of the water fountain roller at which stain occurred at non-image portions of prints.
"*2" represents the lowest rotational speed of the water fountain roller at which ink density lowered at image portions of prints.

developer, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate samples 73 through 96 were obtained. Herein, the preheating section switched off, preheating was not carried out, and washing water for removing a protective layer was not supplied to the pre-washing section. Time taken from completion of exposure till to arrival at the preheating section was within 30 seconds.

| <Developer> | |
|---|---|
| Potassium salt of nonreducing sugar (formed from D-sorbit and K$_2$O) | 50 g/liter |
| OLFINE AK-02 (produced by Nissin Kagaku Co., Ltd.) | 0.15 g/liter |
| C$_{12}$H$_{25}$N(CH$_2$CH$_2$COONa)$_2$ | 1.0 g/liter |

As is apparent from Table 5 above, inventive planographic printing plate material samples provide excellent small dot reproduction, excellent printing durability and excellent water tolerance.

(Preparation of On-Press Development Type Planographic Printing Plate Material Samples 105 Through 130 for an Infrared Laser (830 nm) Source)

(Hydrophilic Layer)

The following materials were sufficiently mixed while stirring, employing a homogenizer, and filtered to obtain a hydrophilic layer coating solution with a solid content of 15% by weight. Then, the hydrophilic layer coating solution was coated on each surface of the supports 1 through 26 obtained above with a wire bar to obtain a hydrophilic layer with a dry thickness of 2.0 g/m$^2$, dried at 100° C. for 3 minutes, and further subjected to aging at 60° C. for 24 hours.

| (Hydrophilic layer coating solution) | |
| --- | --- |
| Metal oxide particles having a light-to-heat conversion capability, Black iron oxide particles ABL-207 (produced by Titan Kogyo K.K., octahedral form, average particle diameter: 0.2 μm, specific surface area: 6.7 m$^2$/g, Hc: 9.95 kA/m, σs: 85.7 Am$^2$/kg, σr/σs: 0.112) | 12.50 parts |
| Colloidal silica (alkali type): Snowtex XS (solid content: 20% by weight, produced by Nissan Kagaku Co., Ltd.) | 60.62 parts |
| Aqueous 10% by weight sodium phosphate dodecahydrate solution (Reagent produced by Kanto Kagaku Co., Ltd.) | 1.13 parts |
| Aqueous 10% by weight solution of water-soluble chitosan FLOWNACK S (produced by Kyowa Technos Co., Ltd.) | 2.50 parts |
| Aqueous 1% by weight solution of Surfactant SURFINOL 465 (produced by Air Products Co., Ltd.) | 1.25 parts |
| Pure water | 22.00 parts |

Subsequently, the following image formation layer coating solution was coated on the hydrophilic layer, employing a wire bar, dried at 55° C. for 3 minutes to give an image formation layer with a dry thickness of 1.50 g/m$^2$, and further subjected to aging at 40° C. for 24 hours.

| (Image formation layer coating solution) | |
| --- | --- |
| Aqueous polyurethane TAKELAC W-615 (solid content: 35% by weight, produced by Mitsui Takeda Chemical Co., Ltd.) | 17.1 parts |
| Aqueous block isocyanate TAKENATE XWB-72-N67 (solid content: 45% by weight, produced by Mitsui Takeda Chemical Co., Ltd.) | 7.1 parts |
| Aqueous solution (solid content: 10% by weight) of sodium acrylate AQUALIC DL522 (produced by Nippon Shokubai Co., Ltd.) | 5.0 parts |
| Ethanol solution (solid content: 1% by weight) of light-to-heat conversion dye ADS 830AT (produced by American Dye Source Co., Ltd.) | 30.0 parts |
| Pure water | 40.8 parts |

(Image Formation)

Employing a plate setter TREND SETTER 3244 (produced by Creo Co., Ltd.), in which a 830 nm laser was installed, the planographic printing plate material sample obtained above was imagewise exposed at an exposure of 250 mJ/cm$^2$ and at a resolving degree of 2400 dpi to obtain an image with a screen number of 175. The image pattern used for the exposure comprised a solid image and a dot image with 1 to 99% dot area. Thus, planographic printing plate samples 105 through 130 were obtained.

(Printing Method)

The planographic printing plate material sample was imagewise exposed as above to obtain a planographic printing plate sample. Employing the exposed printing plate sample, printing was carried out on a press (DAIYA1F-1 produced by Mitsubishi Jukogyo Co., Ltd.), wherein a coat paper, printing ink (soybean oil-based ink "Naturalist 100" produced by Dainippon Ink Kagaku Kogyo Co., Ltd.), and dampening water (SG-51, H solution produced by Tokyo Ink Co., Ltd., Concentration: 1.5%) were used.

(Printing Method, Small Dot Reproduction, Printing Durability, and Water Tolerance)

Printing was carried out in the same manner as above, and small dot reproduction, printing durability and water nce were evaluated according to the same method as bed above. The results are shown in Table 6.

TABLE 6

| Printing plate No. | Support No. | Smallest dot area reproduced (%) | Printing durability (Number) | *1 (%) | *2 (%) | Rotational speed difference *2 − *1 (%) | Remarks |
| --- | --- | --- | --- | --- | --- | --- | --- |
| 105 | 1 | 2 | 100000 | 24 | 45 | 21 | Inv. |
| 106 | 2 | 2 | 100000 | 24 | 45 | 21 | Inv. |
| 107 | 3 | 2 | 100000 | 24 | 45 | 21 | Inv. |
| 108 | 4 | 2 | 100000 | 24 | 45 | 21 | Inv. |
| 109 | 5 | 2 | 100000 | 24 | 45 | 21 | Inv. |
| 110 | 6 | 3 | 100000 | 24 | 45 | 21 | Inv. |
| 111 | 7 | 3 | 105000 | 24 | 45 | 21 | Inv. |
| 112 | 8 | 3 | 105000 | 24 | 45 | 21 | Inv. |
| 113 | 9 | 3 | 100000 | 25 | 45 | 20 | Inv. |
| 114 | 10 | 3 | 80000 | 25 | 45 | 20 | Inv. |
| 115 | 11 | 3 | 80000 | 25 | 45 | 20 | Inv. |
| 116 | 12 | 3 | 80000 | 26 | 45 | 19 | Inv. |
| 117 | 13 | 3 | 75000 | 25 | 45 | 20 | Inv. |
| 118 | 14 | 4 | 75000 | 25 | 45 | 20 | Inv. |
| 119 | 15 | 4 | 75000 | 25 | 42 | 17 | Inv. |
| 120 | 16 | 4 | 75000 | 25 | 44 | 19 | Inv. |
| 121 | 17 | 4 | 75000 | 26 | 44 | 18 | Inv. |
| 122 | 18 | 4 | 75000 | 26 | 44 | 18 | Inv. |
| 123 | 19 | 4 | 75000 | 26 | 44 | 18 | Inv. |
| 124 | 20 | 4 | 50000 | 28 | 42 | 14 | Comp. |
| 125 | 21 | 4 | 50000 | 30 | 44 | 14 | Comp. |
| 126 | 22 | 3 | 50000 | 30 | 43 | 13 | Comp. |
| 127 | 23 | 4 | 35000 | 28 | 44 | 16 | Comp. |
| 128 | 24 | 4 | 40000 | 28 | 44 | 16 | Comp. |

TABLE 6-continued

| Printing plate No. | Support No. | Smallest dot area reproduced (%) | Printing durability (Number) | *1 (%) | *2 (%) | Rotational speed difference *2 − *1 (%) | Remarks |
|---|---|---|---|---|---|---|---|
| 129 | 25 | 4 | 50000 | 30 | 44 | 14 | Comp. |
| 130 | 26 | 4 | 30000 | 28 | 44 | 16 | Comp. |

Inv.: Invention.,
Comp.: Comparative
"*1" represents the highest rotational speed of the water fountain roller at which stain occurred at non-image portions of prints.
"*2" represents the lowest rotational speed of the water fountain roller at which ink density lowered at image portions of prints.

As is apparent from Table 6 above, inventive planographic printing plate material samples provide excellent small dot reproduction, excellent printing durability and excellent water tolerance.

What is claimed is:

1. A process for manufacturing an aluminum support for a planographic printing plate material having a negative working image formation layer which is a photopolymerizable image formation layer comprising a photopolymerizable composition, the process comprising the steps of:
   (a) electrolytically surface-roughening an aluminum plate; and, thereafter,
   (b) anodizing the surface-roughened aluminum plate, wherein the step (a) contains:
   (i) a first stage which surface-roughens the aluminum plate employing a sine-wave alternating current in a first electrolyte solution containing hydrochloric acid as a main component; and, thereafter
   (ii) a second stage which surface-roughens the aluminum plate employing a controlled sine-wave alternating current using a thyristor so that a current flow starts at a phase angle of 60 to 120 degree of an alternating current cycle, in a second electrolyte solution containing hydrochloric acid as a main component.

2. The process for manufacturing an aluminum support of claim 1,
   wherein a ratio of an electrolysis operating time (seconds) in the first stage ($t_1$) to an electrolysis operating time (seconds) in the first stage ($t_2$), $t_1:t_2$ is between 1:1 and 5:1; and
   a total quantity of electricity Q which is obtained by adding a quantity of electricity in the first stage ($Q_1$) and a quantity of electricity in the first stage ($Q_2$) is between 600 and 1500 C/dm$^2$.

3. The process for manufacturing an aluminum support of claim 1,
   wherein each of the first and second electrolyte solutions has a hydrochloric acid concentration of 5 to 20 g/liter and an aluminum ion concentration of 0.5 to 15 g/liter, and a temperature of each electrolyte solution is from 15 to 35 0° C.

4. The process for manufacturing an aluminum support of claim 1,
   wherein each electrolyte solution further contains acetic acid in an amount of from 1 to 20 g/liter.

5. The process for manufacturing an aluminum support of claim 1,
   wherein each electrolyte solution further contains boric acid in an amount of from 1 to 20 g/liter.

6. The process for manufacturing an aluminum support of claim 1,
   wherein the first and second electrolyte solution are the same solution, so that the first stage and the second stage in the step (a) are carried out in the same electrolyte solution.

7. An aluminum support for a planographic printing plate prepared according to the process of claim 1.

8. A planographic printing plate material comprising the aluminum support of claim 7, and provided thereon, said negative working image formation layer.

9. The planographic printing plate material of claim 8, wherein the image formation layer is capable of being developed on a printing press.

10. An image formation process comprising the steps of: imagewise exposing the planographic printing plate material of claim 8 to a laser.

* * * * *